(12) United States Patent
Harvey et al.

(10) Patent No.: US 9,025,342 B2
(45) Date of Patent: May 5, 2015

(54) SELF-ADJUSTING CLAMP SYSTEM

(75) Inventors: Rex J. Harvey, Mentor, OH (US);
Robert A. Frindt, Jr., Chardon, OH (US)

(73) Assignee: Parker-Hannifin Corporation, Cleveland, OH (US)

( * ) Notice: Subject to any disclaimer, the term of this patent is extended or adjusted under 35 U.S.C. 154(b) by 2058 days.

(21) Appl. No.: 11/779,611

(22) Filed: Jul. 18, 2007

(65) Prior Publication Data

US 2008/0239690 A1 Oct. 2, 2008

Related U.S. Application Data

(60) Provisional application No. 60/807,663, filed on Jul. 18, 2006.

(51) Int. Cl.
*H05K 7/14* (2006.01)
*H05K 7/18* (2006.01)
*G06F 1/18* (2006.01)

(52) U.S. Cl.
CPC ............. *H05K 7/1404* (2013.01); *G06F 1/183* (2013.01)

(58) Field of Classification Search
USPC ......... 361/756, 801–802, 686, 788, 752, 800, 361/790, 797, 759
See application file for complete search history.

(56) References Cited

U.S. PATENT DOCUMENTS

| 3,971,186 | A | | 7/1976 | Havelka et al. |
| 4,354,770 | A | | 10/1982 | Block |
| 4,414,605 | A | | 11/1983 | Chino et al. |
| 4,480,287 | A | | 10/1984 | Jensen |
| 5,057,968 | A | * | 10/1991 | Morrison ...................... 361/700 |
| 5,211,496 | A | | 5/1993 | Hurowitz |
| 5,414,592 | A | * | 5/1995 | Stout et al. .................... 361/704 |
| 5,485,353 | A | | 1/1996 | Hayes et al. |
| 6,615,997 | B2 | | 9/2003 | Danello et al. |
| 6,873,528 | B2 | * | 3/2005 | Hulan et al. .................. 361/719 |
| 7,031,167 | B1 | * | 4/2006 | Zagoory et al. ............... 361/759 |
| 2003/0146176 | A1 | | 8/2003 | Danello et al. |

OTHER PUBLICATIONS

Curtiss Wright Controls, Inc.; "VITA 48 (aka VPX-REDI)."

* cited by examiner

*Primary Examiner* — Hung S Bui
(74) *Attorney, Agent, or Firm* — Renner, Otto, Boisselle & Sklar, LLP

(57) ABSTRACT

A wedge lock clamping assembly, system and method wherein the module to be clamped in a slot in a chassis has a pair of wedge surfaces oppositely inclined to spaced-apart side surfaces of the slot. The clamping assembly comprises a pair of wedge elements on opposite sides of a movement axis and each wedge element is configured to be disposed within the slot between a respective wedge surface of the module and a respective side surface of the slot. An actuator operates to forcibly urge the wedge elements along the movement axis for causing the wedge elements to be wedged between the respective wedge surfaces of the module and respective side surfaces of the slot for clamping the module in the slot. A toggle is interposed between the wedge elements and the actuator for equalizing the force acting on each wedge element such that the wedge elements will move axially relative to one another to accommodate any difference in gap widths between the wedge surfaces of the module and side surfaces of the slots thereby to minimize any lateral shifting of the module relative to the slot while still securing clamping the module in the slot.

20 Claims, 4 Drawing Sheets

SELF-ADJUSTING CLAMP SYSTEM

RELATED APPLICATION

This application claims the benefit of U.S. Provisional Application No. 60/807,663 filed Jul. 18, 2006, which is hereby incorporated herein by reference in its entirety.

FIELD OF THE INVENTION

The invention herein described relates generally to clamp systems for clamping a movable component between spaced apart surfaces, and more particularly to such systems for clamping electronic modules within slots in a chassis of a rack or sub-rack, including in particular fluid-cooled electronic modules and chassis assemblies with transition sensitive connectors.

BACKGROUND

A commonly used electronic packaging process is for electrical "daughter" modules, such as circuit boards or modules, to be plugged perpendicularly into respective connectors on a "motherboard". The term motherboard is often used synonymously with the term backplane to describe a circuit board that contains general circuitry and connectors into which other circuit boards or modules can be plugged. The connectors provide both a physical mount and an electrical interconnect between the daughter boards (modules) and the backplane (motherboard). Usually the backplane is incorporated into a rack (or sub-rack) that may include a chassis or enclosure that surrounds and protects the circuit boards. The chassis may be supplied with guides such as slots and/or pins for guiding the boards into proper position for mating with the connectors on the chassis and further to support the daughter boards with respect to the enclosure or chassis.

Wedge-clamps heretofore have been provided on the edges of the circuit boards or modules as a means to securely hold the edges of the circuit boards in the slots in the chassis. Such wedge-clamps are typically located between one edge of the circuit board and a wall of a slot formed in the chassis. Tightening the wedge clamp forces the board to reference to the chassis slot rather than the (usually underlying) motherboard to which it may be connected. If the slots and motherboard connection are not accurately aligned relative to one another, the board will translate and/or bend and the connector will be stressed, creating a point of possible failure.

The problem is more acute when the circuits are packaged in module form. Typically such modules have a rigid cube-like housing, containing electronics circuitry mounted on one or more circuit boards. The module also has one or more connectors usually located along an edge of the module for electrical connection to a motherboard/backplane. The module includes guides, usually provided on opposite sides of the module, to fit into the slots in the chassis. The guide-slot alignment for locking the guides in place with conventional wedge-clamps requires that the module housing and the chassis slots be formed with relatively precise tolerances to obtain a proper fit and locking action. This increases the cost (in terms of time, labor and expense) of manufacture of such components.

SUMMARY OF THE INVENTION

The present invention provides a wedge lock clamping assembly, system and method that can accommodate tolerance variations and misalignments while avoiding the stresses caused by prior art wedge lock systems. In particular, the present invention provides a wedge lock clamping assembly, system and method that self-adjusts to compensate for any misalignment between the module and guide slot in which the module is clamped.

More particularly, the invention provides a wedge lock clamping assembly, system and method wherein the module to be clamped in a slot in a chassis has a pair of wedge surfaces oppositely inclined to spaced-apart side surfaces of the slot. The clamping assembly comprises a pair of wedge elements on opposite sides of a movement axis and each wedge element is configured to be disposed within the slot between a respective wedge surface of the module and a respective side surface of the slot. An actuator operates to forcibly urge the wedge elements along the movement axis for causing the wedge elements to be wedged between the respective wedge surfaces of the module and respective side surfaces of the slot for clamping the module in the slot. A toggle is interposed between the wedge elements and the actuator for equalizing the force acting on each wedge element such that the wedge elements will move axially relative to one another to accommodate any difference in gap widths between the wedge surfaces of the module and side surfaces of the slots thereby to minimize any lateral shifting of the module relative to the slot while still securing clamping the module in the slot.

In a preferred embodiment, the toggle includes a toggle link having opposite end portions operatively connected to wedge elements and a central portion operatively connected to the actuator. Each end of the toggle link may be connected by a pivot pin to the respective wedge element. Each pivot pin may be fixed to one of the toggle link and respective wedge element, and the other of the toggle link and respective wedge element may have a laterally extending slot in which the pin is received and laterally movable.

The toggle link may be pivotally mounted to a force transfer member, and the actuator may include an axially elongate actuator rod having a threaded portion engaged in a threaded bore in the force transfer member such that rotation of the actuator rod effects axial movement of the force transfer member along the actuator rod. The actuator rod may have at an axial end thereof an engagement device for engagement by a tool used to rotate the actuator rod.

The wedge elements preferably are resiliently biased toward one another, in particular by a spring member attached at opposite ends to the wedge elements whereby the wedge elements can be resiliently biased against the wedge surfaces of the module.

One or more of the wedge elements and corresponding wedge surfaces may have cooperating interference surfaces preventing the wedge element or elements from being removed edgewise from the module. The cooperating interference surfaces may be formed by a mating key and slot.

In a preferred embodiment, the wedge lock clamping assembly comprises opposed pairs of wedge elements each configured to be disposed within the slot between a respective wedge surfaces of opposed pairs of wedge surfaces on the module and respective side surfaces of the slot. The actuator may include an axially elongate actuator rod having oppositely threaded portions respectively engaged in threaded bores in force transfer members such that rotation of the actuator rod in one direction effects axial movement of the force transfer members towards one another along the actuator rod for urging respective toggles toward one another to urge the wedge elements into wedged engagement between the wedge surfaces and the side walls of the slot.

The invention also provides a method of clamping a module in a slot in a chassis, using a wedge lock clamping assembly as above summarized. The method comprises the step of operating the actuator to urge the wedge elements against the wedge surfaces, with the toggle allowing the wedge elements to shift axially relative to one another to accommodate any difference in gap widths between the wedge surfaces of the module and side surfaces of the slots.

Additionally, the invention provides a electronics module mountable in a slot in a chassis, comprising a module body having opposed edges and a wedge lock member located at one of the edges. The wedge lock member has opposed pairs of oppositely inclined wedge surfaces configured for insertion in the slot.

The foregoing and other features of the invention are hereinafter more fully described and particularly pointed out in the claims, the following description setting forth in detail certain illustrative embodiments of the invention, these being indicative, however, of but a few of the various ways in which the principles of the invention may be employed.

DETAILED DESCRIPTION

Figure 1:
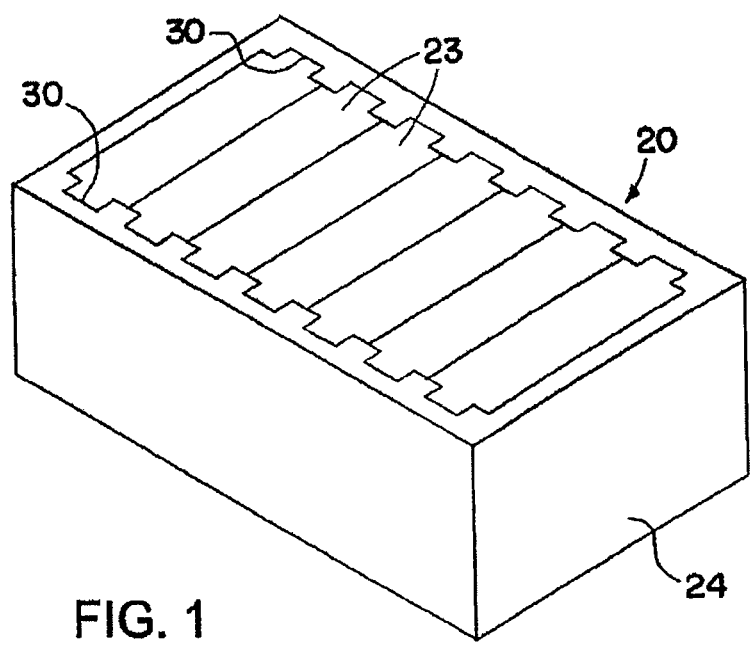
FIG. 1 is a schematic perspective view showing a plurality of electronic modules plugged into a chassis.

Referring now to the drawings, and initially to FIG. 1, a chassis 20 has plugged therein one or more electronic modules 23. The electronic modules 23 may be of a type, such as circuit board modules or modules that may use air and/or liquid for cooling (or heating) electronic components contained in the modules. Such modules may have an fluid-tight interior enclosure in which the electronic components are housed. The electronic components may be mounted to one or more circuit boards in the modules, and a single circuit board can be viewed as a simple form of a module. More commonly the modules will include one or more circuit boards enclosed in a rigid cube-like housing.

The electronic modules may be arranged in one or more rows, or in different patterns as may be desired. The chassis may be in the form of an open-sided enclosure that has at the blind side thereof, electrical connectors (not shown) that mate with electrical connectors 27 of the modules to establish an electrical interconnect between the electronic modules and the chassis. The electrical connectors in the chassis typically will be connectors mounted to a backplane of the chassis for mating with electrical connectors of the modules, which may be, for example, pin connectors or card edge connectors containing a plurality of contacts. The chassis may or may not have end closures 24. The chassis may be provided with guide slots 30 for guiding the edges of the modules during insertion into the chassis and for supporting the modules once inserted in the chassis along with the physical connection between the electrical connectors of the modules and the backplane, the backplane normally being connected to the structural or frame components of the chassis.

Although the modules 23 are shown with edge guides closely fitted in the slots 30, usually edge guides on the modules will be narrower than the slots to allow for tolerance variations between the slots of the chassis 20 and the electrical connectors mounted to the backplane, as well as tolerance variations in the modules, and further to accommodate wedge clamping assemblies that serve to secure the modules in the chassis.

Figure 2:
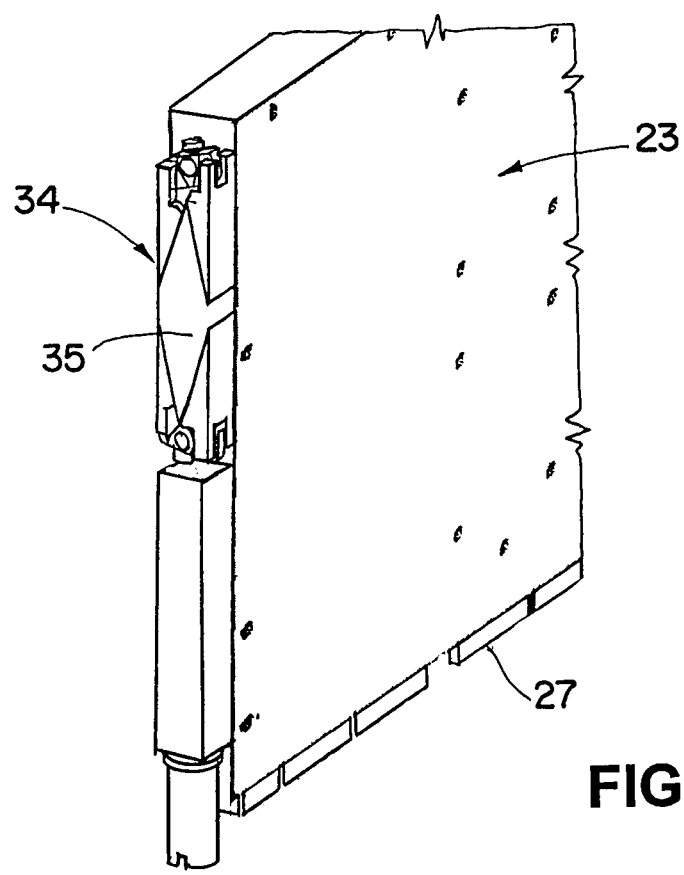
FIG. 2 is fragmentary perspective view of an exemplary electronics module on which is assembled an exemplary wedge lock clamping assembly according to the invention.

In FIG. 2, an exemplary wedge lock clamping assembly is indicated at 34. The clamping assembly 34 is shown assembled on a wedge member 35 that preferably is integral to the module, but which alternatively may be a separate attachment. As shown, the wedge member 35 may project from an edge of the module 23 for receipt in a slot 30 in the chassis of the chassis 20 (FIG. 1).

Figure 3:
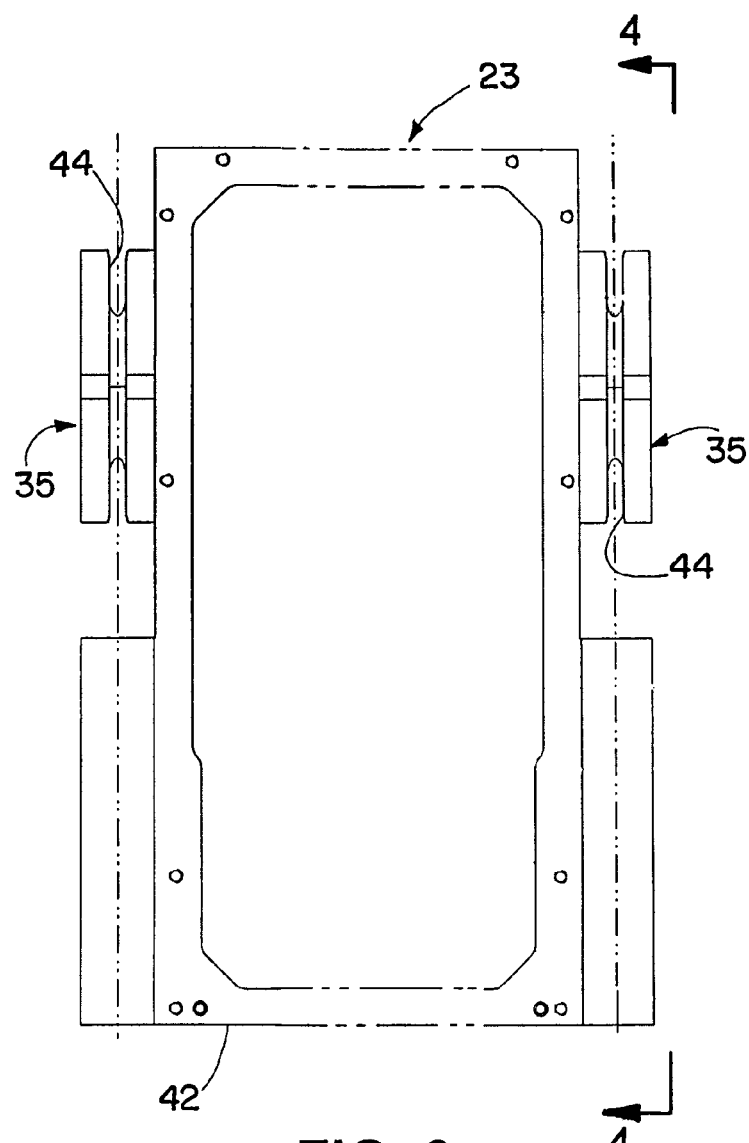
FIG. 3 is a fragmentary side elevational view of the module of FIG. 2.
Figure 4:
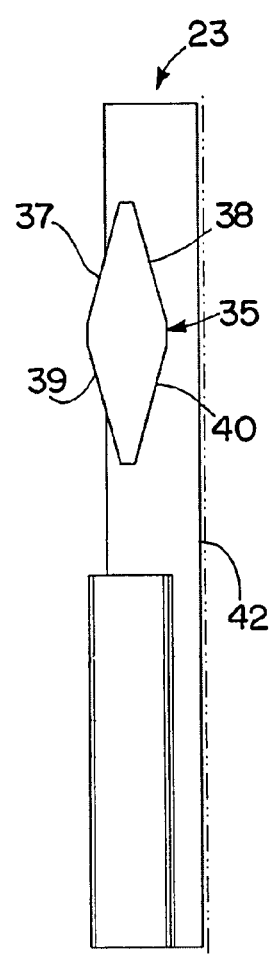
FIG. 4 is an edge view of the module of FIG. 2, looking from the line 4-4 of FIG. 3.

As seen in FIGS. 3 and 4, the module 23 has a wedge member 35 at opposite edges thereof. In the illustrated exemplary system, each wedge member 35 has one pair of wedge surfaces 37 and 38 and an oppositely disposed pair of wedge surfaces 39 and 40. All of the wedge surfaces are inclined to a center plane of the module, and the wedge surfaces of each pair are oppositely inclined as shown. In the illustrated embodiment, the wedge surfaces collectively form a diamond shape, although it will be appreciated that the pairs of wedge surfaces can be spaced apart as may be desired for some applications. Additionally, the angle of the incline may be varied as desired to provide for different adjustment gains. The wedge surfaces of each pair may be symmetrically disposed relative to a center plane of the module body 42 or other plane such as one that may be offset from the center plane of the module housing as shown in FIG. 4. One or more of the wedge surfaces may also be provided with one half of an interference/guide device to be described below in greater detail. It is mentioned here, though, that the illustrated interference/guide device includes a slot in the form of a center groove 44 in each wedge surface, although it will be appreciated that other guides are possible as desired.

Figure 5:
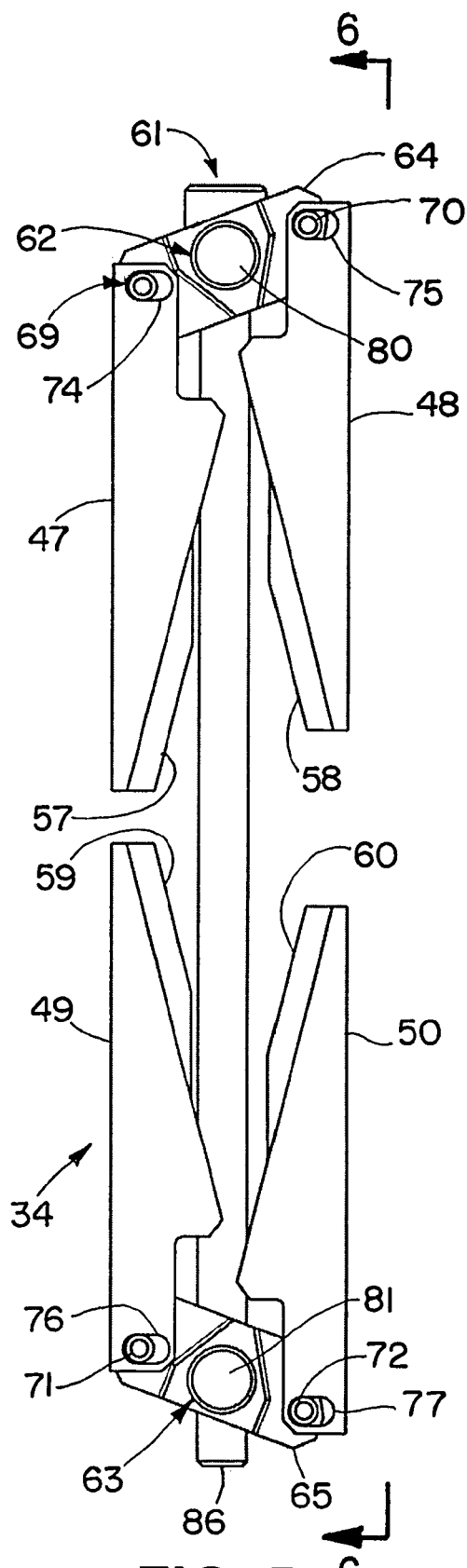
FIG. 5 is an elevational view of the wedge lock clamping assembly of FIG. 2.
Figure 6:
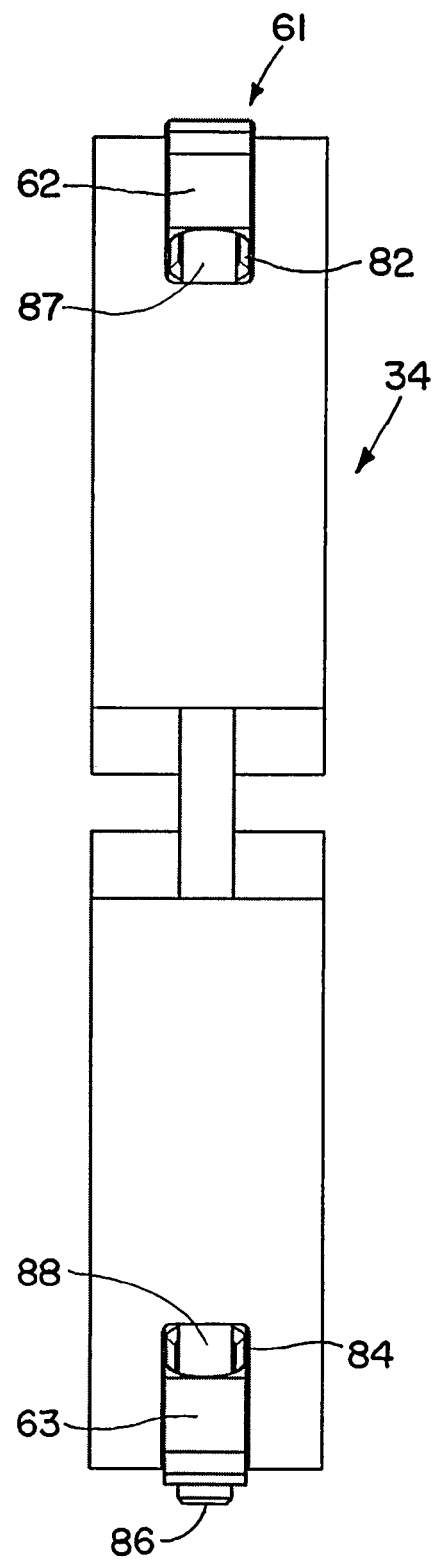
FIG. 6 is an elevational view of the wedge lock clamping assembly looking from the line 6-6 of FIG. 5.
Figure 8:
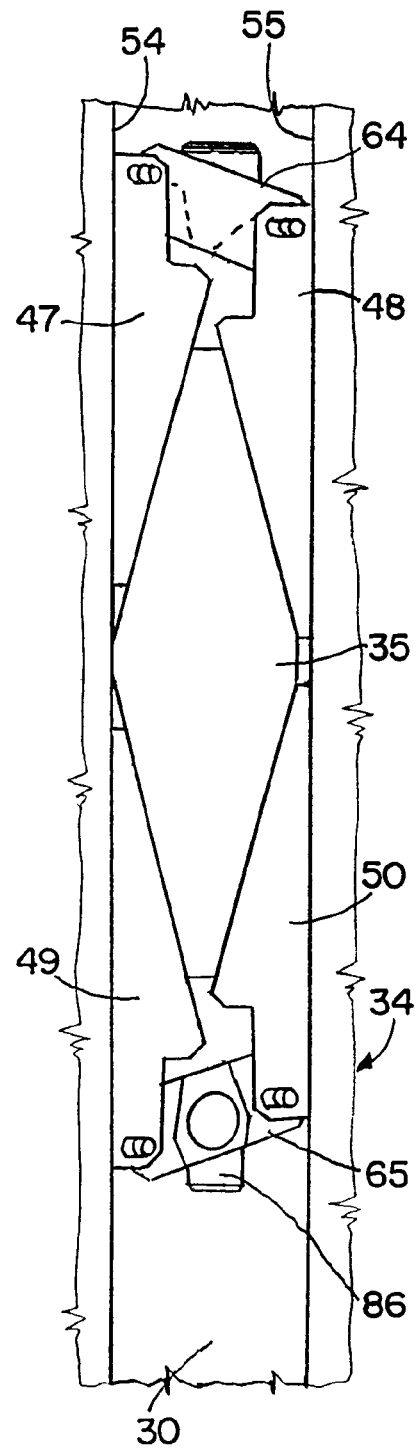
FIG. 8 is an elevational view of the clamping assembly installed on the module and secured in a slot where the wedge member on the module is not centered in the slot.

Referring now to FIGS. 5 and 6, the exemplary clamping assembly 34 can be seen to comprise two pairs of wedge elements with the wedge elements 47 and 48 of one pair being oppositely oriented to respective wedge elements 49 and 50 of the other pair. As illustrated in FIG. 8, each wedge element 47, 48, 49, 50 is configured to be disposed within the chassis slot 30 between a respective wedge surface 37, 38, 39, 40 of the module (FIG. 4) and a respective side surface 54, 55 of the chassis slot. In the illustrated embodiment, the chassis slot side surfaces 54 and 55 are parallel, and each wedge element may generally have the shape of a right angle triangle, with one side of the triangle being arranged to slide on a side surface of the slot and the inclined (hypotenuse) side of the triangle being arranged to slide on the respective wedge surface of the wedge member on the module.

One or more of the wedge elements may have the other half of the interference/guide device, such being a key formed by a rib 57-60 on the inclined surface of the wedge element that mates in the groove 44 in the respective wedge surface of the wedge member. The mating rib and groove reside in the movement plane of the wedge elements and serve to guide the wedge element relative to the respective wedge surface. In addition, the mating rib and groove serve to hold the clamping assembly on the wedge member against edgewise movement.

In addition to the wedge elements, the clamping assembly includes an actuator 61 that operates to forcibly urge the wedge elements 47-50 along the movement axis for causing the wedge elements to be wedged between the respective wedge surfaces of the wedge member on the module and respective side surfaces of the chassis slot for clamping the module in the chassis slot. A toggle 62, 63 is interposed between the wedge elements of each pair thereof and the actuator for equalizing the force acting on each wedge element such that the wedge elements will move axially relative to one another to accommodate any difference in gap widths between the wedge surfaces of the module and side surfaces of the slots thereby to minimize any lateral shifting of the module relative to the slot while still securing clamping the module in the slot.

In the illustrated embodiment, each toggle 62, 63 includes a toggle link (arm) 64, 65 having opposite end (arm) portions operatively connected to respective wedge elements, and a central portion operatively connected to the actuator. Each end of the toggle link may be located in a clevis portion of the respective wedge element and connected thereto by a respective pivot pin 69-72. Each pivot pin may be fixed to one of the toggle link and respective wedge element, and the other of the toggle link and respective wedge element may have a laterally extending slot 74-77 in which the pin is received and laterally movable to allow flush engagement of the wedge elements against the side walls of the chassis slot and the wedging surfaces of the wedge member. As will be appreciated, the toggle link can pivot to allow the wedge elements to shift longitudinally relative to one another.

The toggle links 64 and 65 may be pivotally mounted on respective pins 80 and 81 that function as force transfer members 82 and 84, and the actuator may include an axially elongate actuator rod 86 having at least one threaded portion 88 engaged in a correspondingly threaded bore in the force transfer member 84. The rod 86 may have an oppositely threaded portion engaged in a correspondingly threaded bore in the force transfer member 82. In the illustrated embodiment, the bore in the force transfer member is simply a through bore in which the rod can move, while a laterally enlarged head engages an axial outer side of the force transfer member. Consequently, in either case, rotation of the actuator rod effects axial movement of the force transfer members toward and away from one another along the actuator rod. The actuator rod may have at an axial end thereof an engagement device for activating the wedge lock, such as a hex socket 90 (FIG. 7), for engagement by a tool used to rotate the actuator rod. The rod itself can have features to allow activation of the wedge lock assembly.

Figure 7:
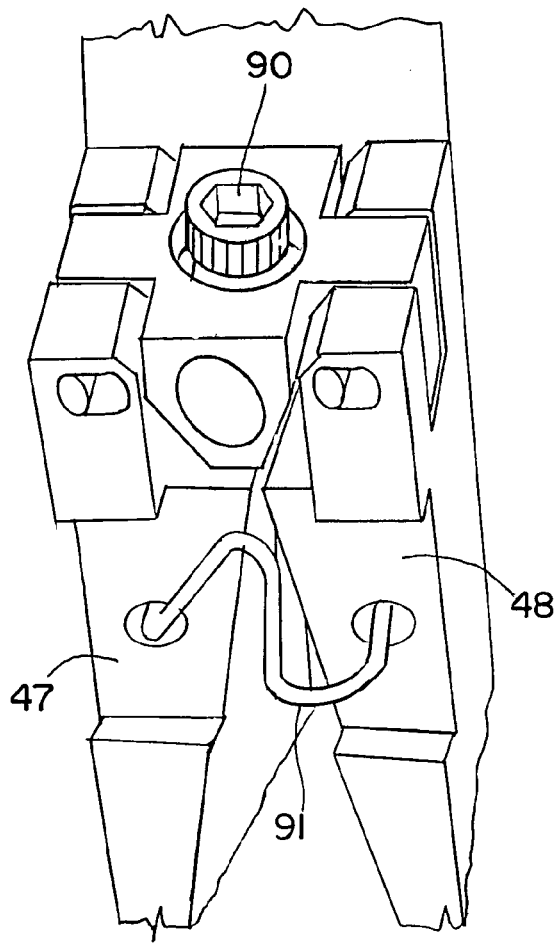
FIG. 7 is a fragmentary perspective view showing an exemplary means for biasing the wedge elements of the clamping assembly towards one another.

The wedge elements of each pair preferably are resiliently biased toward one another, in particular by a spring member 91 attached at opposite ends to the wedge elements such as shown in FIG. 7 whereby the wedge elements can be resiliently biased against the wedge surfaces of the module. The illustrated exemplary spring member 90 is a bent spring wire connected at its ends to the wedge elements of a corresponding pair, such as by insertion at the ends in retention holes in the wedge elements, and edge surfaces of the wedge elements and wedge member may be recessed to accommodate the spring. The illustrated spring connection is exemplary and other resilient means may be used to bias the wedge elements of each pair toward one another. The biasing force will assist in causing the toggle to rotate as the wedge elements bear against the wedge surfaces of the wedge member that are not centered between the side surfaces of the slot 30.

This is illustrated in FIG. 8 where the wedge member 35 can be seen to be off center to the left in the figure. Consequently, the gap at the left-side of the wedge member is smaller than the gap at the right-side. The clamping assembly 34, when tightened against the wedge member, will self-adjust to accommodate the different size gaps and thereby not cause the module to be shifted, which could otherwise result in stresses being applied to the module and thus to the connectors between the module and the backplane of the chassis. Initial rotation of the actuator rod 86 will cause the toggle links 64 and 65 to move towards one another until the left-hand wedge element of each pair engages corresponding wedge surfaces of the wedge member, if not already engaged such as by the action of the above-described springs. The wedge elements will slide along the wedge surfaces and thereby will be moved apart until the wedge elements on one side of the wedge member engage the adjacent side wall of the chassis slot. Further rotation of the actuator rod will cause the toggle to pivot allowing the other wedge elements to shift closer to one another as seen in FIG. 8. This will cause the right-hand wedge elements to overlap the wedge member to a greater extent and fill the gap between the right-hand side of the wedge member and the corresponding wall of the slot. Once the gap on each side of the wedge member has been "filled" by the corresponding wedge elements, further tightening of the actuator rod will tightly wedge the wedge elements between the wedge member and side walls of the chassis slot thereby to securely clamp the module in the chassis without having to shift the module in the chassis to accommodate any misalignment of the module relative to the chassis slot.

Thus, the shortening effect of screwing the bottom equalizer pivot towards the top equalizer pivot drives the wedge elements together and therefore outward. The top and the bottom pairs of wedge elements are free to float up and down with respect to the fixed diamond ramp surfaces on the wedge member to allow both the top pair and the bottom pair of wedge elements to stay symmetric top to bottom, even when only the bottom equalizer arm pivot is being driven along the actuator rod.

The principles of the present invention can be applied to clamp a variety of different type of devices herein generally referred to as modules, as will be appreciated by those skilled in the art. The present invention, however, is particularly applicable to clamping electronic modules in chassis assemblies as above described. An exemplary module/chassis alignment system to which the principles of the invention may be applied is shown in U.S. patent Ser. No. 11/379,705, which is hereby incorporated herein by reference.

Although the invention has been shown and described with respect to a certain embodiment or embodiments, it is obvious that equivalent alterations and modifications will occur to others skilled in the art upon the reading and understanding of this specification and the annexed drawings. In regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A wedge lock clamping assembly for clamping a module in a slot in a chassis, wherein the slot has spaced-apart side surfaces and the module has a first pair of wedge surfaces oppositely inclined to the side surfaces when inserted in the slot, the clamping assembly comprising:
a first pair of wedge elements on opposite sides of a movement axis and each configured to be disposed within the slot between a respective wedge surface of the module and a respective side surface of the slot;
an actuator for forcibly urging the wedge elements along the movement axis for causing the wedge elements to be wedged between the respective wedge surfaces of the module and respective side surfaces of the slot for clamping the module in the slot; and
a first toggle interposed between the wedge elements and the actuator for equalizing the force acting on each wedge element such that the wedge elements will move axially relative to one another to accommodate any difference in gap widths between the wedge surfaces of the module and side surfaces of the slots thereby to minimize any lateral shifting of the module relative to the slot while still securely clamping the module in the slot.

2. The wedge lock clamping assembly according to claim 1, wherein the first toggle is a toggle link having opposite end portions operatively connected to wedge elements and a central portion operatively connected to the actuator.

3. The wedge lock clamping assembly according to claim 2, wherein each end of the toggle link is connected by a pivot pin to the respective wedge element.

4. The wedge lock clamping assembly according to claim 3, wherein each pivot pin is fixed to one of the toggle link and respective wedge element, and the other of the toggle link and respective wedge element have a laterally extending slot in which the pin is received.

5. The wedge lock clamping assembly according to claim 4, wherein the toggle link is pivotally mounted to a force transfer member, and the actuator includes an axially elongate actuator rod having a threaded portion engaged in a threaded bore in the force transfer member such that rotation of the actuator rod effects axial movement of the force transfer member along the actuator rod.

6. The wedge lock clamping assembly according to claim 5, wherein the actuator rod has at an axial end thereof an engagement device for engagement by a tool used to rotate the actuator rod.

7. The wedge lock clamping assembly according to claim 6, wherein the wedge elements are resiliently biased toward one another.

8. The wedge lock clamping assembly according to claim 7, wherein the wedge elements are resiliently biased toward one another by a spring member attached at opposite ends to the wedge elements whereby the wedge elements can be resiliently biased against the wedge surfaces of the module.

9. The wedge lock clamping assembly according to claim 1, wherein the wedge elements are resiliently biased toward one another.

10. The wedge lock clamping assembly according to claim 9, wherein the wedge elements are resiliently biased toward one another by a spring member attached at opposite ends to the wedge elements whereby the wedge elements can be resiliently biased against the wedge surfaces of the module.

11. The wedge lock clamping system comprising the wedge lock clamping assembly of claim 1 and the module to be clamped in the slot in the chassis.

12. The wedge lock clamping system according to claim 11, wherein at least one wedge element and corresponding wedge surface have a cooperating interference surfaces preventing the wedge element from being removed edgewise from the module.

13. The wedge lock clamping system according to claim 12, wherein the cooperating interference surfaces are formed by a mating key and slot.

14. The wedge lock clamping system according to claim 11, further comprising the chassis with the slot therein.

15. The wedge lock clamping system according to claim 12, wherein the chassis includes a plurality of slots for respective modules, and wherein respective clamping assemblies are provided for the modules and slots.

16. The A wedge lock clamping assembly according to claim 1, for use with a module that has a second pair of wedge surfaces axially oppositely disposed to the first pair of wedge surfaces, the clamping assembly further comprising a second pair of wedge elements on opposite sides of the movement axis and each configured to be disposed within the slot between a respective one of the second pair of wedge surfaces and a respective side surface of the slot, and a second toggle interposed between the wedge elements of the second pair and the actuator for equalizing the force acting on each wedge element of the second pair such that the wedge elements of the second pair will move axially relative to one another to accommodate any difference in gap widths between the wedge surfaces of the of the first pair and side surfaces of the slots thereby to minimize any lateral shifting of the module relative to the slot while still securing clamping the module in the slot, and wherein the force acting on the wedge elements of the second pair is in a direction opposite the force acting on the wedge elements of the first pair.

17. The wedge lock clamping assembly according to claim 16, wherein the first and second toggles include respective links pivotally mounted to respective force transfer members, and the actuator includes an axially elongate actuator rod having a threaded portion engaged in a threaded bore in at least one of the force transfer members such that rotation of the actuator rod in one direction effects axial movement of the force transfer members towards one another along the actuator rod.

18. The wedge lock clamping assembly according to claim 16, wherein the wedge elements are identical.

19. A method of clamping a module in a slot in a chassis, wherein a wedge lock clamping assembly has been assembled to a pair of wedge surfaces on the module that are oppositely inclined to the side surfaces when inserted in the slot, the clamping assembly comprising a first pair of wedge elements on opposite sides of a movement axis and each configured to be disposed within the slot between a respective wedge surface of the module and a respective side surface of the slot; an actuator for forcibly urging the wedge elements along the movement axis for causing the wedge elements to be wedged between the respective wedge surfaces of the module and respective side surfaces of the slot for clamping the module in the slot; and a first toggle interposed between the wedge elements and the actuator for equalizing the force acting on each wedge element such that the wedge elements will move axially relative to one another to accommodate any difference in gap widths between the wedge surfaces of the module and side surfaces of the slots thereby to minimize any lateral shifting of the module relative to the slot while still securing clamping the module in the slot; and the method comprising the step of operating the actuator to urge the wedge elements against the wedge surfaces, with the toggle allowing the wedge elements to shift axially relative to one another to accommodate any difference in gap widths between the wedge surfaces of the module and side surfaces of the slots.

20. A wedge lock clamping assembly for clamping a component in a slot in a support, wherein the slot has spaced-apart side surfaces and the component has a first pair of wedge surfaces oppositely inclined to the side surfaces when inserted in the slot, the clamping assembly comprising:
- a first pair of wedge elements on opposite sides of a movement axis and each configured to be disposed within the slot between a respective wedge surface of the component and a respective side surface of the slot;
- an actuator for forcibly urging the wedge elements along the movement axis for causing the wedge elements to be wedged between the respective wedge surfaces of the component and respective side surfaces of the slot for clamping the component in the slot; and
- a first toggle interposed between the wedge elements and the actuator for equalizing the force acting on each wedge element such that the wedge elements will move axially relative to one another to accommodate any difference in gap widths between the wedge surfaces of the component and side surfaces of the slot thereby to minimize any lateral shifting of the component relative to the slot while still securely clamping the component in the slot.

\* \* \* \* \*